United States Patent
Boskamp

(10) Patent No.: US 6,411,090 B1
(45) Date of Patent: Jun. 25, 2002

(54) MAGNETIC RESONANCE IMAGING TRANSMIT COIL

(75) Inventor: Eddy B. Boskamp, Menomonee Falls, WI (US)

(73) Assignee: GE Medical Systems Global Technology Company, LLC, Waukesah, WI (US)

( * ) Notice: Subject to any disclaimer, the term of this patent is extended or adjusted under 35 U.S.C. 154(b) by 0 days.

(21) Appl. No.: 09/681,970

(22) Filed: Jul. 2, 2001

(51) Int. Cl.[7] .................................................. G01V 3/00
(52) U.S. Cl. ........................ 324/318; 324/309; 324/322
(58) Field of Search ................................ 324/318, 309, 324/322, 307; 128/653

(56) References Cited

U.S. PATENT DOCUMENTS

| | | | | |
|---|---|---|---|---|
| 4,665,368 A | * | 5/1987 | Sugiyama et al. | 324/318 |
| 5,144,243 A | * | 9/1992 | Nabayashi et al. | 324/318 |
| 5,445,153 A | * | 8/1995 | Sugie et al. | 124/653.5 |
| 6,150,816 A | | 11/2000 | Srinivasan | 324/318 |
| 6,169,400 B1 | | 1/2001 | Sakuma | 324/318 |

FOREIGN PATENT DOCUMENTS

EP          0 366 188         *   5/1990

* cited by examiner

Primary Examiner—Edward Lefkowitz
Assistant Examiner—Brij B. Shrivastav
(74) Attorney, Agent, or Firm—Michael A. Della Penna

(57) ABSTRACT

A magnetic resonance imaging (MRI) coil system is provided which comprises an RF coil element comprising a plurality of electrically conductive members spaced to form a generally tubular structure and defining an imaging volume. The coil element is adapted to receive a RF signal and apply a magnetic field to the imaging volume. A signal generator generates the RF signal, and a power splitter is adapted to distribute the RF signal across each of the plurality of electrically conductive members in signals of equal power. A phase shifter receives the split signals from the signal splitter and equally phase shifts each of the split RF signals across each of the plurality of electrically conductive members such that each conductor carries the signal at a different phase angle with respect to each other conductor. An amplifier is coupled to each of the conductors for independently controlling the current amplitude of the signal carried on the respective conductor.

16 Claims, 4 Drawing Sheets

MAGNETIC RESONANCE IMAGING TRANSMIT COIL

BACKGROUND OF THE INVENTION

The present invention relates to the field of magnetic resonance imaging (MRI) systems and, more particularly, concerns radio frequency (RF) coils for use in such systems.

In MRI systems or nuclear magnetic resonance (NMR) systems, radio frequency signals are provided in the form of circularly polarized or rotating magnetic fields having an axis of rotation aligned with a main magnetic field. An RF field is then applied in the region being examined in a direction orthogonal to the static field direction, to excite magnetic resonance in the region, and resulting RF signals are detected and processed. Receiving coils intercept the radio frequency magnetic field generated by the subject under investigation in the presence of the main magnetic field in order to provide an image of the subject. Typically, such RF coils are either surface-type coils or volume-type coils, depending upon the particular application. Normally, separate RF coils are used for excitation and detection, but the same coil or array of coils may be used for both purposes.

Conventional MRI systems have a number of artifact problems. For example, aliasing of unwanted signals into the resonance object image is a common problem in MRI applications. A particular form of artifact, sometimes referred to as an aliasing artifact, can occur in the either the frequency direction or the phase direction within MRI systems. In this type of artifact, an area of anatomy that is at least partially within the excitation field of the body coil has a local Larmor frequency identical to a pixel within the imaging field of view. This phenomenon typically originates from areas outside the field of view, but causes artifacts inside the image. It often arises as a result of the non-linearity of the gradient fields and/or non-homogeneity of the DC magnetic fields.

Accordingly, to reduce the occurrences of unwanted artifacts, there exists a need for MRI power can be lost in cables and switches before the power gets to the transmit coil.

Another advantage of the present invention is that different RF field shapes can be generated with a single coil thereby enabling selective excitation within the imaging volume.

Other objects and advantages of the invention will become apparent upon reading the following detailed description and appended claims, and upon reference to the accompanying drawings.

BRIEF DESCRIPTION OF DRAWINGS

For a more complete understanding of this invention, reference should now be made to the embodiments illustrated in greater detail in the accompanying drawings and described below by way of examples of the invention.

In the drawings.

DETAILED DESCRIPTION

Figure 1:
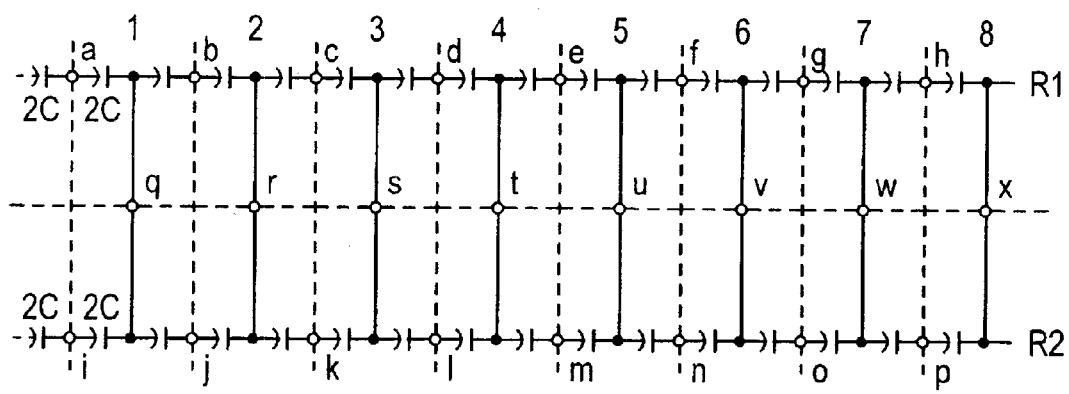
FIG. 1 is a planar schematic view of a high pass birdcage coil.

In describing the characteristics of the transmit coil arrangement of the present invention, it is useful to have an understanding of distributed-type volume coils in general and a birdcage transmit coil in particular. In this regard, referring to FIG. 1, there is shown a planar schematic view of a high pass birdcage coil. A birdcage coil consists of two rings connected by several straight segments referred to as legs. A planar schematic of an eight-leg high-pass birdcage is shown in FIG. 1. This coil consists of two end rings R1 and R2 and eight legs, 18.

The birdcage which is of the distributed inductance-capacitance type structure has several frequency modes. Of interest is the homogeneous mode which sets up a homogeneous RF magnetic field. The homogeneous mode has two linear components, oriented orthogonal to one another. At the homogeneous mode, the currents in the coil are cosinusoidally distributed such that the resultant field displayed has a homogeneous distribution over the imaging field of view (FOV). The points where the planes of symmetry intersect the birdcage are "a, b, c, d, e, f, g, h" on ring R1 and "i, j, k, l, m, n, o, p" on ring R2, and "q, r, s, t, u, v, w, x" on legs 1, 2, 3, . . . 8, respectively of FIG. 1. Since points q through x are located on the virtual ground plane, these points are at virtual ground potential or have no net potential.

Figure 2:
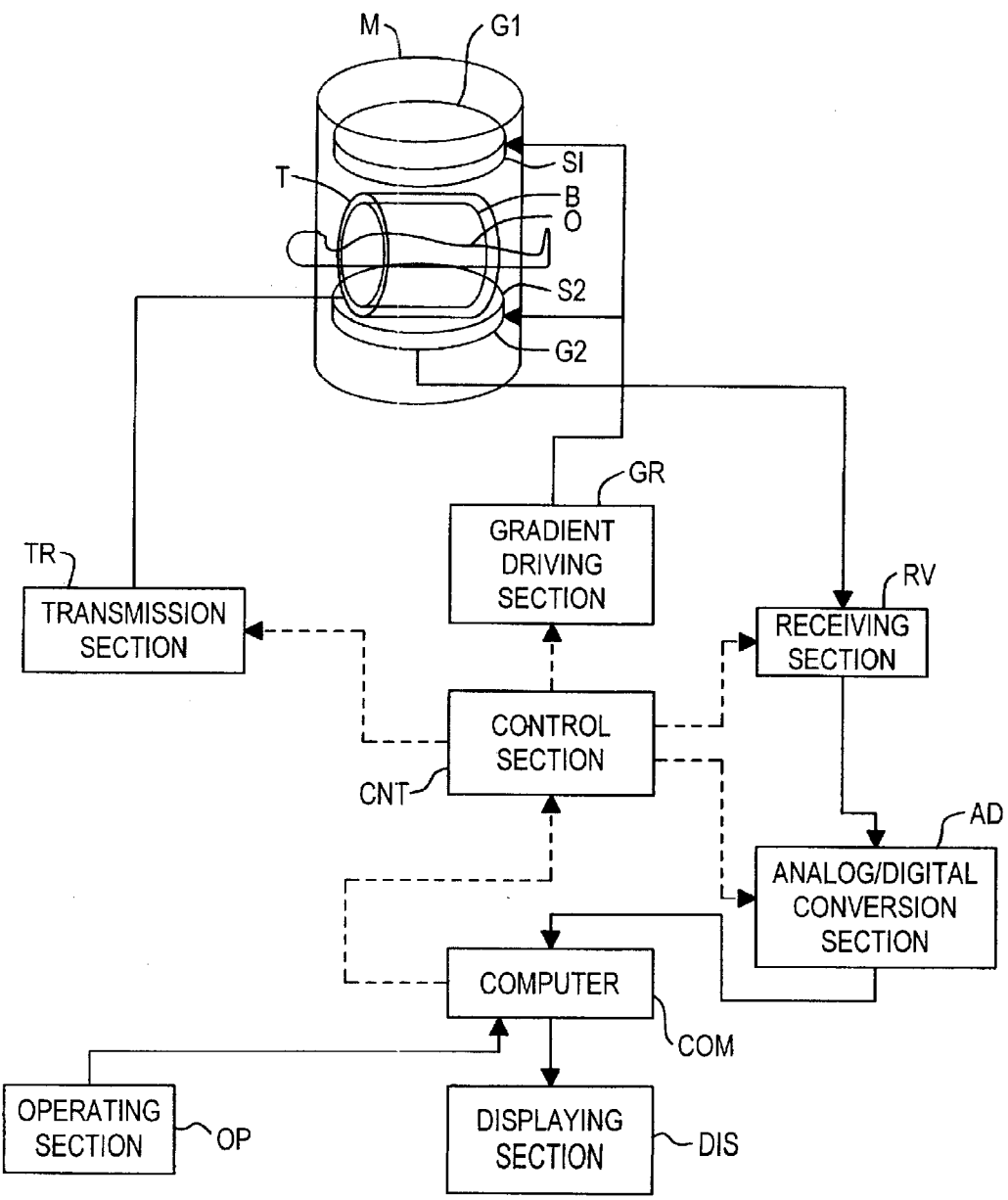
FIG. 2 is a block diagram of a magnetic resonance imaging system according to one embodiment of the present invention.

Referring now to FIG. 2, there is shown a block diagram of an MRI system operable to perform a magnetic resonance imaging by using a radio frequency coil according to the present invention.

The system of FIG. 2 is operated such that a static magnetic field generating section M may form a uniform static magnetic field in its inner space. The static magnetic field generating section M is comprised of a pair of magnetic generators formed by permanent or superconductive magnets (not shown), for example, these magnetic generators are spaced apart in a horizontal direction and oppositely faced to each other so as to form a static magnetic field (a horizontal magnetic field) in the opposing space. Each of the gradient coil sections G is arranged at the front surface of the magnetic generator and they are similarly spaced apart and opposed in a horizontal direction from each other.

A transmission coil section T forming a cylindrical assembly is installed within the static magnetic field space between the gradient coil sections G. A body coil section B forming a cylindrical assembly is installed within the static magnetic field space within the transmission coil T. A central axis of the body coil section B is crossed at a right angle with a direction of the static magnetic field. Between the gradient coil sections G and the transmission coil T there is an RF shield S that shields the transmission coils from the gradient coils. Although separate RF coils are shown for excitation (transmission coil T) and detection (body coil B), the same coil or array of coils may be used for both purposes.

An inspected body O is inserted into the inner space of the body coil section B. A body axis of the inspected body O is aligned with a direction of the static magnetic field.

transmission coil section TR is connected to the transmission coil T. The transmission coil section TR applies a driving signal to the transmission coil T so as to generate a radio (RF) magnetic field, thereby a spin in the body of the inspected body O is excited. The transmission coil T and transmission coil section TR is one example of a preferred embodiment of the transmission coil of the present invention. Details of the transmission coil will be described below with reference to FIG. 3. A gradient driving section GR is connected to the gradient coil sections G. The gradient driving section GR applies a driving signal to the gradient coil sections G so as to generate a gradient magnetic field. To the body coil section B is connected a receiving section RV. To the receiving section RV is inputted a magnetic resonance receiving signal received by the body coil section B.

To the receiving section RV is connected an analog-to-digital conversion section AD. The analog-to-digital conversion section AD operates to convert an output signal of the receiving section RV into a digital signal. The analog-to-digital conversion section AD is connected to a computer COM. To the computer COM is inputted a digital signal from the analog-to-digital conversion section AD, wherein an image reforming process is carried out in response to the input digital signal, and an image of the inspected body O is generated.

To the computer COM a displaying section DIS and an operating section OP are connected. The displaying section DIS displays an image generated by the computer COM. The displaying section DIS also displays various kinds of information outputted from the computer COM. The operating section OP is operated by an operator so as to input various kinds of instructions or information to the computer COM.

To the computer COM is also connected a control section CNT. The control section CNT is connected to the transmission section TR, the gradient driving section GR, the receiving section RV, the analog-to-digital conversion section AD and the imaging table on which the inspected body O rests. The control section CNT receives instructions from the computer COM and outputs control signals to each of the transmission section TR, the gradient driving section GR, the receiving section RV, the analog-to-digital conversion section AD and the imaging table so as to perform an imaging operation.

Figure 3:
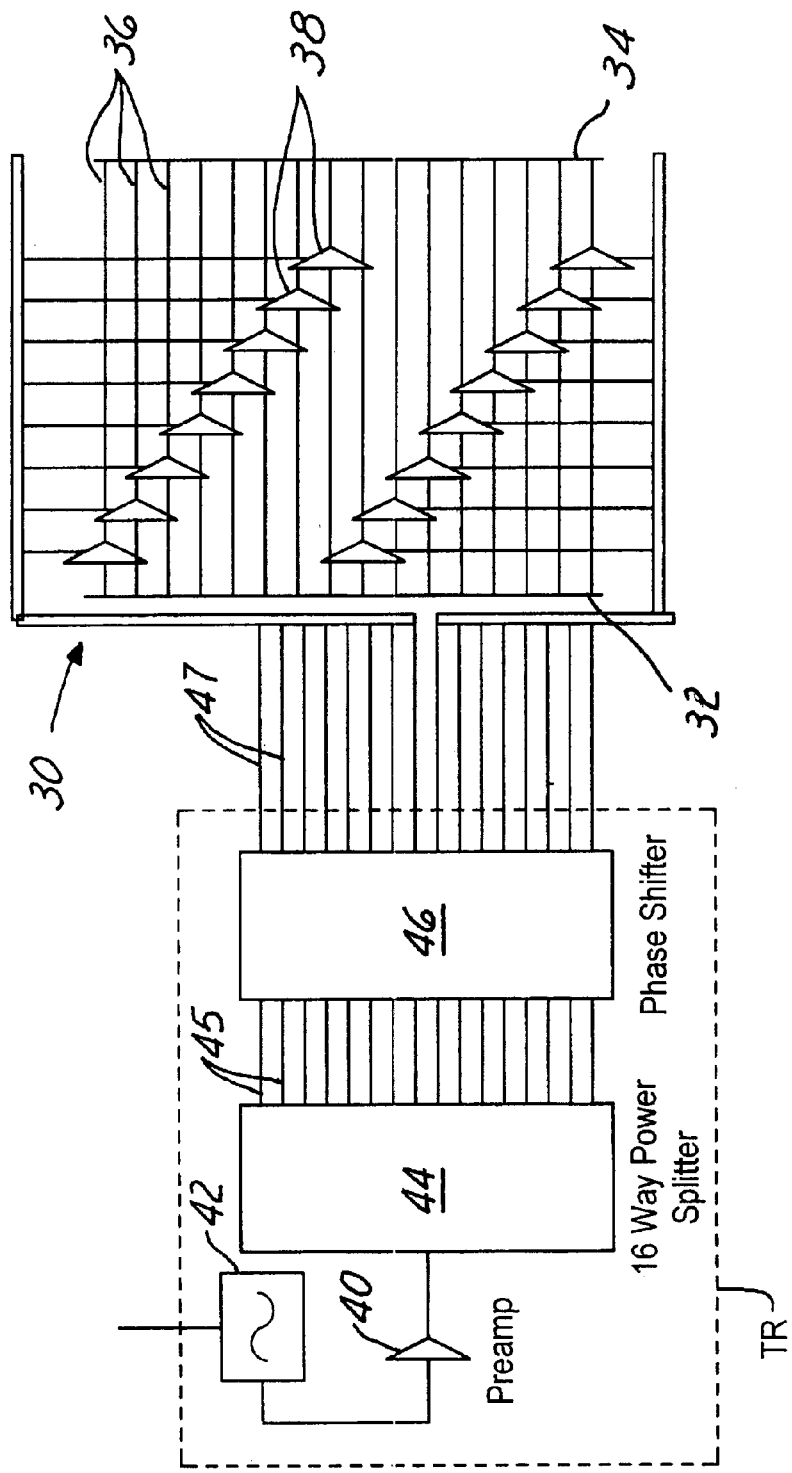
FIG. 3 is a schematic diagram of one embodiment of a transmit coil according to the present invention.

Referring now to FIG. 3 there is shown a schematic block diagram of one embodiment of the transmit coil T according to the present invention for use in the exemplary system of FIG. 2. In this example, the transmit coil comprises a sixteen leg or rung birdcage 30. Thus, between each ring 32, 34 of the birdcage 30 there extends sixteen legs 36. For simplicity, the birdcage 30 is shown in the planar configuration. Each leg 36 of the transmit coil 30 includes an amplifier 38 which is preferably a MOSFET amplifier. Preferably, each power amplifier 38 comprises a single power MOSFET or a push-pull configuration amplifier such as MRF154 available from Motorola Corporation, as well as the associated DC circuitry and matching circuitry. In this regard, careful attention should be given to the routing of the DC current so as not to impair the homogeneity of the DC magnetic field. Preferably, the matching circuitry is designed for maximum energy transfer between the power amp 38 and the coil rungs 36, as well as between the different components of the transmission section TR. In addition, a pickup loop can be integrated into each leg or rung 36 to monitor the current amplitude and phase, and the signal can be fed back to the amplifier to ensure stable levels of amplitude and phase. An example of such circuitry is discussed below with reference to FIG. 4.

The transmission section TR operates to control the excitation of the transmission coil 30. In this example, a preamplifier 40 amplifies the RF pulse from the waveform generator 42 to levels acceptable for the input of the power amplifiers 38 which are integrated into the transmit coil 30.

In the case of the sixteen-rod birdcage shown in FIG. 3, the amplified RF pulse is split by a sixteen-way power splitter 44 which divides the power into sixteen equal components. Any conventional power splitter design can be used for this task and the implementation thereof be readily apparent to one of skill in the art of RF electronics. The resulting sixteen power signals 45 are communicated to a sixteen-way phase shifter 46 to provide sixteen signals 47 having a sinusoidal amplitude distribution. Each of the signals 47 is then communicated to a corresponding gate of a power amplifier 38 associated with a birdcage rung 36. In this example, the phase shift between two neighboring power channels is 22.5° C., which represents 360° C. across channels 1 through 16. In the case of an eight conductor birdcage coil, the phase shift between two neighboring power channels is 45° C., which represents 360° C. across the eight conductors. Other well known components which comprise the birdcage such as capacitors, inductors, and matching circuits are not shown for the sake of simplicity.

FIG. 3 is one example of a preferred application according to the present invention. The illustrated embodiment, however, is intended to be exemplary and not limiting. Indeed, the integrated power amplifier configuration of the present invention is equally applicable to any type of known homogeneous transmit coils including TEM transmit coils and birdcage coils.

Figure 4:
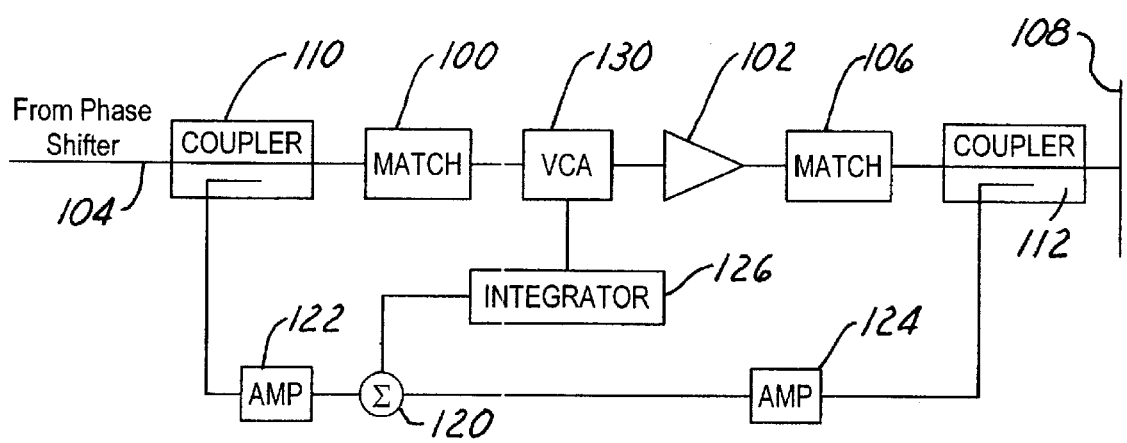
FIG. 4 is a schematic diagram of one embodiment of connection circuitry for the transmit coil of FIG. 3.

Referring now to FIG. 4 there is shown an exemplary embodiment of the circuitry connections for a power amplifier and associated rung of the birdcage coil of FIG. 3. In FIG. 4, the matching network 100 is configured to match the input impendence of the power amplifier 102 (power MOSFET) to the 50 ohm coaxial cable 104 from the phase shifter. Matching network 106 matches the output impendence of the power amplifier 102 to the impendence looking into the corresponding rung 108 of the birdcage coil. In this way, the energy transfer from the power amplifier 102 to the rung 108 is maximized. Couplers 110, 112 measure the input signal and output signal, respectively. Preferably, coupler 112 is in the form of a pick-up loop to measure the current amplitude in the rung 108. The respective signals from the input coupler 110 and output coupler 112 are compared at summer 120 after amplification by amplifiers 122, 124. An error signal results if the input and output signals differ. The resulting error signal is integrated by integrator 126 and communicated to the voltage controlled attenuator 130 which regulates the input signal until the error is zero.

From the foregoing, it can be seen that there has been brought to the art a new and improved transmission coil for MRI applications which provides advantages over conventional transmission coils. While the invention has been described in connection with one or more embodiments, it should be understood that the invention is not limited to those embodiments. On the contrary, the invention covers all alternatives, modifications, and equivalents, as may be included within the spirit and scope of the appended claims. systems having improved linearity of gradient fields and homogeneity of DC magnetic fields or RF transmit coils with zero sensitivity outside the field of view.

SUMMARY OF INVENTION

In the present invention, a distributed integrated power amplifier is proposed which enables the construction of transmit coils having improved field of view regulation and drop off outside the field of view.

In particular, the present invention provides a radio frequency (RF) coil apparatus for resonance imaging/analysis comprising a plurality of axial conductors spaced to form a generally tubular structure and define an imaging volume.

Each of the axial conductors has a first end and a second end. A first ring conductor is coupled to the first ends and a second ring conductor is coupled to the second ends to form a birdcage coil. An independently controllable amplifier is coupled to each respective axial conductor for independently controlling a current amplitude of a signal carried on said respective conductor.

In another aspect of the invention, a magnetic resonance imaging (MRI) coil system is provided which comprises an RF coil element comprising a plurality of electrically conductive members spaced to form and generally tubular structure and defining an imaging volume. The coil element is adapted to receive a RF signal and apply a RF magnetic field to the imaging volume. A signal generator generates the RF signal, and a power splitter is adapted to distribute the RF signal across each of the plurality of electrically conductive members in signals of equal power. A phase shifter receives the split signals from the signal splitter and equally phase shifts each of the split RF signals across each of the plurality of electrically conductive members such that each conductor carries the signal at a different phase angle with respect to each other conductor. An amplifier is coupled to each of the conductors for independently controlling the current amplitude of the signal carried on said respective conductor.

An advantage of the present invention is that it enables higher order transmit coils and arrays which eliminate artifacts by not exciting the artifact regions. Another advantage is that the present invention provides precise current amplitude and phase control throughout the transmit coil, thereby ensuring optimal homogeneity of the RF magnetic field.

A further advantage of the present invention is that it eliminates power losses between the power amp and the RF coil, in contrast to typical MRI systems wherein between 1 and 2 dB of

What is claimed is:

1. A radio frequency (RF) coil apparatus for resonance imaging/analysis comprising:
    a plurality of axial conductors spaced to form and generally tubular structure and define an imaging volume, each axial conductor having first and second ends;
    a first ring conductor coupled to the first ends;
    a second ring conductor coupled to the second ends; and
    a plurality of amplifiers, each of said amplifiers coupled to a respective axial conductor for independently controlling a current amplitude of a signal carried on said respective conductor.

2. The RF coil of claim 1 wherein the plurality of axial conductors equals between eight and sixteen.

3. The RF coil of claim 1 wherein each amplifier comprises a power MOSFET amplifier.

4. A magnetic resonance imaging (MRI) coil system comprising:
    an RF coil element comprising a plurality of electrically conductive members spaced to form and generally tubular structure and defining an imaging volume, said coil element being adapted to receive a RF signal and apply a magnetic field to said imaging volume;
    a signal generator for generating said RF signal;
    a power splitter adapted to distribute said RF signal across each of said plurality of electrically conductive members;
    a phase shifter adapted to phase shift said RF signal across each of said plurality of electrically conductive members such that each conductor carries said signal at a different phase angle with respect to each other conductor; and
    a plurality of amplifiers, each of said amplifiers coupled to a respective conductor for independently controlling a current amplitude of the signal carried on said respective conductor.

5. The MRI coil system of claim 4 further comprising a controller adapted to independently control each of said amplifiers.

6. The MRI coil system of claim 5 wherein the RF coil element comprises sixteen electrically conductive members.

7. The MRI coil system of claim 6 wherein the power splitter is adapted to split the RF signal into sixteen signals of equal power.

8. The MRI coil system of claim 7 wherein the phase shifter is adapted to receive each of said sixteen power split signals from said power splitter and phase shift each signal by 22.5 degrees with respect to each other signal.

9. The MRI coil system of claim 4 wherein the RF coil element comprises eight electrically conductive members.

10. The MRI coil system of claim 6 wherein the power splitter is adapted to split the RF signal into eight signals of equal power.

11. The MRI coil system of claim 10 wherein the phase shifter is adapted to receive each of said eight power split signals from said power splitter and phase shift each signal by 45 degrees with respect to each other signal.

12. A phased array coil apparatus for use in an nuclear magnetic resonance (NMR) system, the coil comprising a plurality of electrically conductive members spaced to form and generally tubular structure and defining an imaging volume, said coil element being adapted to apply a RF magnetic field to said imaging volume, wherein each of said electrically conductive members is adapted to receive a RF signal and each of said electrically conductive members is configured to independently control a current amplitude of said signal.

13. The phased array coil of said claim 12 wherein each electrically conductive member includes an amplifier for independently controlling a current amplitude of said signal.

14. The phased array coil of said claim 13 wherein each of said amplifiers is a power MOSFET amplifier.

15. The phased array coil of said claim 12 wherein the plurality of electrically conductive members equals eight.

16. The phased array coil of said claim 12 wherein the plurality of electrically conductive members equals sixteen.

* * * * *